United States Patent
Heo et al.

(10) Patent No.: US 10,334,737 B2
(45) Date of Patent: Jun. 25, 2019

(54) FLEXIBLE DISPLAY DEVICE AND MANUFACTURING METHOD THEREOF

(71) Applicant: SAMSUNG DISPLAY CO., LTD., Yongin-si, Gyeonggi-Do (KR)

(72) Inventors: Young Sik Heo, Asan-si (KR); Myeong Seok Jeong, Cheonan-si (KR); Won Ho Lee, Asan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/438,294

(22) Filed: Feb. 21, 2017

(65) Prior Publication Data
US 2017/0359899 A1   Dec. 14, 2017

(30) Foreign Application Priority Data

Jun. 10, 2016 (KR) .......................... 10-2016-0072571

(51) Int. Cl.
*H05K 3/00* (2006.01)
*H05K 1/11* (2006.01)

(52) U.S. Cl.
CPC .......... *H05K 3/0026* (2013.01); *H05K 1/117* (2013.01); *H05K 3/0058* (2013.01); *H05K 2201/10128* (2013.01)

(58) Field of Classification Search
USPC ......................................................... 361/749
See application file for complete search history.

(56) References Cited

U.S. PATENT DOCUMENTS

| | | | |
|---|---|---|---|
| 2014/0134763 A1* | 5/2014 | Park | H01L 51/0014 438/26 |
| 2014/0140037 A1* | 5/2014 | Cho | F21V 9/14 362/19 |
| 2014/0313439 A1* | 10/2014 | Matsumoto | G06F 3/0412 349/12 |

FOREIGN PATENT DOCUMENTS

| | | |
|---|---|---|
| JP | 4928687 | 2/2012 |
| KR | 10-0931001 | 12/2009 |
| KR | 10-2015-0102164 | 9/2015 |
| KR | 10-2016-0025482 | 3/2016 |

* cited by examiner

*Primary Examiner* — Andargie M Aychillhum
(74) *Attorney, Agent, or Firm* — F. Chau & Associates, LLC.

(57) ABSTRACT

A flexible display device includes a flexible substrate that includes a first side; a display unit disposed in a first region of the first side and that includes a plurality of pixels; and a pad portion disposed in a second region of the first side and that includes a plurality of pad electrodes. The flexible substrate includes a stepwise recess portion disposed along an edge of the first side on which end portions of the pad electrodes are provided.

9 Claims, 20 Drawing Sheets

FLEXIBLE DISPLAY DEVICE AND MANUFACTURING METHOD THEREOF

CROSS REFERENCE TO RELATED APPLICATIONS

This application claims priority under 35 USC § 119 from, and the benefit of, Korean Patent Application No. 10-2016-0072571, filed in the Korean Intellectual Property Office on Jun. 10, 2016, the contents of which are herein incorporated by reference in their entirety.

BACKGROUND

1. Technical Field

Embodiments of the present disclosure are generally directed to a flexible display device. More particularly, embodiments of the present disclosure are generally directed to a method for manufacturing a flexible display device that includes a process for incising a substrate by use of laser beams, and a flexible display device manufactured using the same method.

2. Discussion of the Related Art

A flexible display device typically includes a flexible substrate, and a display unit and a pad portion disposed on the flexible substrate. The display unit includes a plurality of signal lines and a plurality of pixels, and displays an image by combining light emitted by the pixels. The pad portion includes a plurality of pad electrodes that transmit electrical signals to signal lines of the display unit.

A method for manufacturing a flexible display device may include forming a plurality of cell areas on a flexible substrate in a raw state, forming a display unit and a pad portion in a plurality of cell areas, irradiating laser beams on edges of the cell areas, and cutting the flexible substrate accordingly. By the above-noted stages, a plurality of flexible display devices can be simultaneously manufactured.

SUMMARY

Embodiments of the present disclosure can provide a method for manufacturing a flexible display device for controlling generation of defects by foreign particles by removing the foreign particles from an cutting portion of a flexible substrate, and a flexible display device manufactured by the same method.

An exemplary embodiment provides a flexible display device that includes a flexible substrate; a display unit disposed in a first region of a first side of the flexible substrate and that includes a plurality of pixels; and a pad portion disposed in a second region of the first side and that includes a plurality of pad electrodes. The flexible substrate includes a stepwise recess portion disposed along an edge of the first side on which end portions of the pad electrodes are provided.

The stepwise recess portion may include a bottom side, and a first lateral side that connects the one side and the bottom side. The bottom side may have protrusions and depressions associated with a plurality of concave grooves. The concave grooves may be adjacent to each other in a direction parallel to the pad electrodes and may extend linearly in a second direction perpendicular to the first direction. The bottom side may be flat. The first lateral side may have a slanted side.

The flexible substrate may include a main substrate that has a first side and a second side that are opposite each other; and a passivation film attached to the second side by an adhesion layer. The display unit and the pad portion may be provided on the first side. The stepwise recess portion may be provided in the main substrate, may be provided in the main substrate and the adhesion layer, or may be provided in the main substrate, the adhesion layer, and the passivation film.

Another embodiment provides a method for manufacturing a flexible display device, including: forming a plurality of cell areas on a first side of a main substrate, and forming a display unit that includes a plurality of pixels and a pad portion that includes a plurality of pad electrodes in each of the cell areas; attaching a passivation film to a second side of the main substrate, that is opposite the first side using an adhesion layer; cutting the main substrate and the passivation film by irradiating a first laser beam on an edge of the cell areas; and removing foreign particles generated by the first laser beam by irradiating a second laser beam on an edge of the first side on which end portions of the pad electrodes are provided. The second laser beam has a shorter wavelength than the first laser beam.

Adjacent cell areas may be separated by a single border line.

The second laser beam may be a short pulse laser beam, and an irradiation width of the second laser beam may be equal to or greater than a width of a region in which the foreign particles are generated. The second laser beam may be focused to one of the main substrate, the adhesion layer, and the passivation film.

The second laser beam may have a Gaussian shape, and may be scanned at least twice while changing an irradiation position in a direction that is parallel to the pad electrodes.

The second laser beam may include a flat front end and may be scanned at least once. The second laser beam may be scanned at least twice while changing an irradiation position in a direction that is parallel to the pad electrodes.

Another embodiment provides a flexible display device that includes a flexible substrate that includes a main substrate with a first side and a second side that are opposite each other; and a passivation film attached to the second side by an adhesion layer. The flexible substrate includes a stepwise recess portion disposed along an end portion thereof, and the stepwise recess portion is provided in the main substrate, is provided in the main substrate and the adhesion layer, or is provided in the main substrate, the adhesion layer, and the passivation film.

The flexible display device may further include a display unit disposed in a first region of the first side of the flexible substrate and that includes a plurality of pixels, and pad portion disposed in a second region of the first side and that includes a plurality of pad electrodes. The stepwise recess portion is disposed along an edge of the first side on which end portions of the pad electrodes are provided.

The stepwise recess portion may include a bottom side and a first lateral side that connects the first side and the bottom side. The bottom side may have protrusions and depressions associated with a plurality of concave grooves that are adjacent to each other in a first direction parallel to the pad electrodes and extend linearly in a second direction perpendicular to the first direction. The bottom side may be flat. The first lateral side may be slanted.

According to exemplary embodiments, the conductive carbonized material does not remain on the flexible substrate when the flexible substrate is cut, so the plurality of pad electrodes can remain insulators. Hence, a flexible display device is substantially free of driving defects caused by electrical connections among the plurality of pad electrodes. Further, there is no dummy area among a plurality of cell areas, which increases the usable area of the flexible substrate and improves productivity.

DETAILED DESCRIPTION

Figure 1:
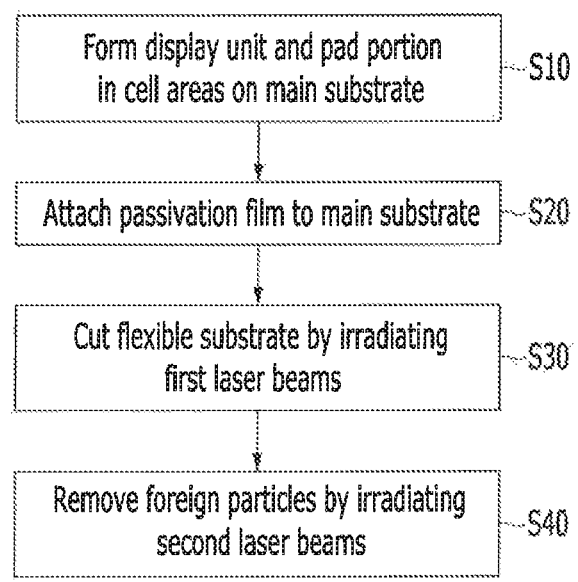
FIG. 1 is a flowchart of a method for manufacturing a flexible display device according to an exemplary embodiment.

Embodiments of the present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

When it is said that any part, such as a layer, film, region, or plate, is positioned on another part, it means the part is directly on the other part or above the other part with at least one intermediate part.

The size and thickness of each component shown in the drawings may be arbitrarily shown for better understanding and ease of description, but embodiments of the present disclosure are not limited thereto.

FIG. 1 is a flowchart of a method for manufacturing a flexible display device according to an exemplary embodiment.

Referring to FIG. 1, a method for manufacturing a flexible display device includes: forming a display unit and a pad portion of a plurality of respective cell areas formed on a first side of a main substrate (S10); attaching a passivation film to a second side of the main substrate using an adhesion layer (S20); irradiating first laser beams to edges of the plurality of cell areas to cut the flexible substrate (S30); and irradiating second laser beams along an edge of the first side on which an end portion of a plurality of pad electrodes are provided (S40).

According to an embodiment, the first laser beam is a laser beam in the infrared wavelength band. The second laser beam has a shorter wavelength than the first laser beam, and it may be a short pulse laser beam. The second laser beam removes foreign particles generated in step S30 to control generation of defects caused by foreign particles in the flexible display device.

A method for manufacturing a flexible display device will now be described in detail with reference to FIG. 2 to FIG. 20. FIG. 2 to FIG. 20 show major constituent elements relating to a manufacturing method of a flexible display device.

Figure 2:
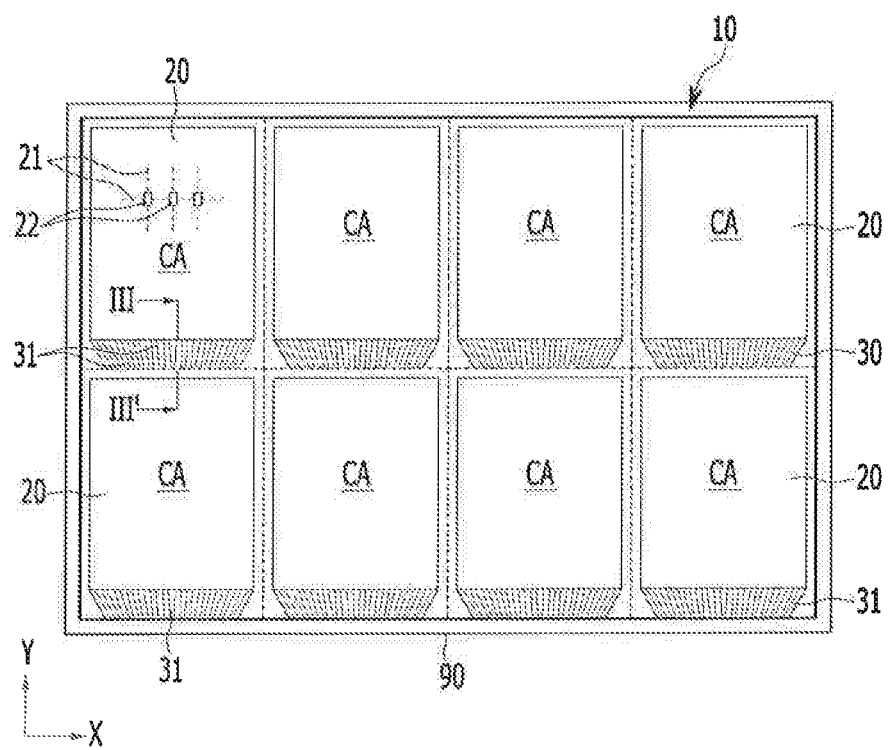
FIG. 2 is a top plan view of a main substrate in a first step shown in FIG. 1.
Figure 3:
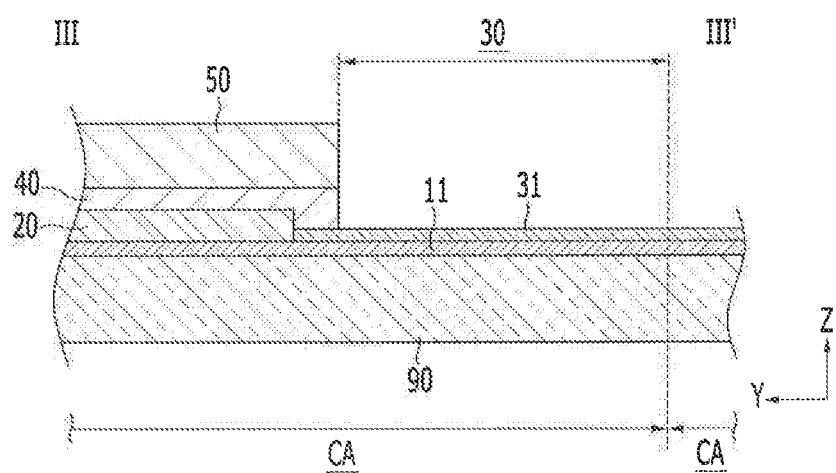
FIG. 3 is a cross-sectional view with respect to line III-III' of FIG. 2.
Figure 4:
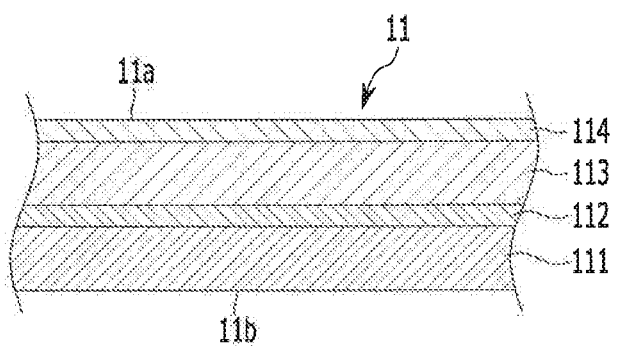
FIG. 4 is an enlarged view of a main substrate shown in FIG. 3.

FIG. 2 is a top plan view of a main substrate in a first step shown in FIG. 1, FIG. 3 is a cross-sectional view with respect to line III-III' of FIG. 2, and FIG. 4 shows an enlarged view of a main substrate shown in FIG. 3.

Referring to FIG. 2 to FIG. 4, in step S10, a main substrate 11 is in a raw state and has a size sufficient to simultaneously manufacture a plurality of flexible display devices. The main substrate 11 is a flexible substrate that can be easy bent, and a hard carrier substrate 90 supports the main substrate 11.

According to an embodiment, the main substrate 11 has a multi-layered structure. For example, the main substrate 11 can have a stacked structure of a first plastic layer 111, a first barrier layer 112, a second plastic layer 113, and a second barrier layer 114. The first plastic layer 111 and the second plastic layer 113 may include a polyimide. The first barrier layer 112 and the second barrier layer 114 may include a silicon nitride film and a silicon oxide film. However, embodiments of the main substrate 11 are not limited to the above-described example.

According to an embodiment, the main substrate 11 includes a first side 11a and a second side 11b that oppose each other. A plurality of cell areas (CA) are provided on the first side 11a of the main substrate 11, and a display unit 20 and a pad portion 30 are formed in each of the plurality of respective cell areas (CA). FIG. 2 shows eight cell areas (CA) for convenience of description, but embodiments are not limited thereto, and in other embodiments, more cell areas (CA) are provided on the main substrate 11. The pad portion 30 is provided on one side of the display unit 20, and one cell area (CA) corresponds to one flexible display device.

According to an embodiment, the display unit 20 includes a plurality of signal lines 21 and a plurality of pixels 22, and the pad portion 30 includes a plurality of pad electrodes 31. The pad electrodes 31 are electrically connected to the signal lines 21, and, after step S40, are electrically connected to a chip on film (COF). The pad electrodes 31 can transmit an electrical signal received from the COF to the signal lines 21.

A flexible display device according to a present exemplary embodiment is an organic light emitting device, in which each pixel 22 includes at least two thin film transistors, at least one capacitor, and an organic light emitting diode. According to an embodiment, the display unit 20 is covered by an encapsulator 40, and an upper passivation film 50 is disposed on the encapsulator 40. The encapsulator 40 is a stacked structure of an inorganic film, an organic film, and an inorganic film.

According to an embodiment, in step S10, a plurality of cell areas (CA) are arranged so that their edges meet each other in an X direction and a Y direction, where the X direction is perpendicular to the Y direction. That is, no dummy areas are provided between the plurality of cell areas (CA), and two adjacent cell areas (CA are separated by a single border line.

Figure 5:
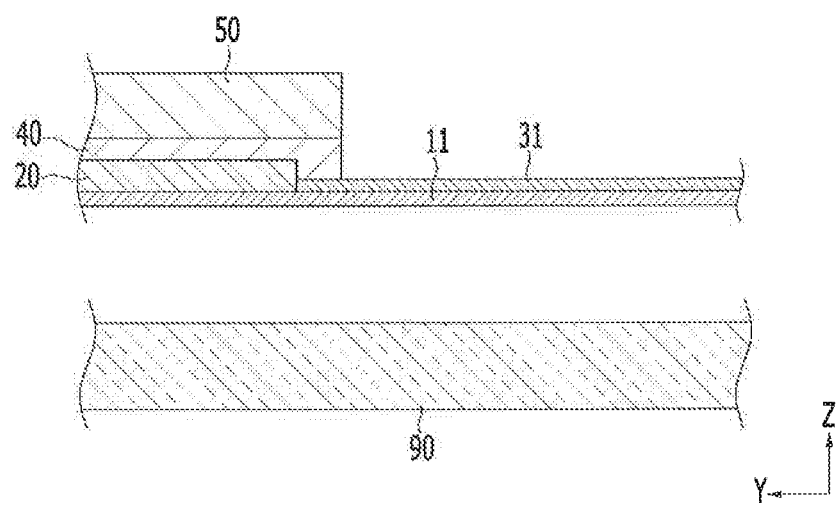
FIG. 5 and FIG. 6 are partial cross-sectional views of a main substrate and a passivation film in a second step shown in FIG. 1.
Figure 6:
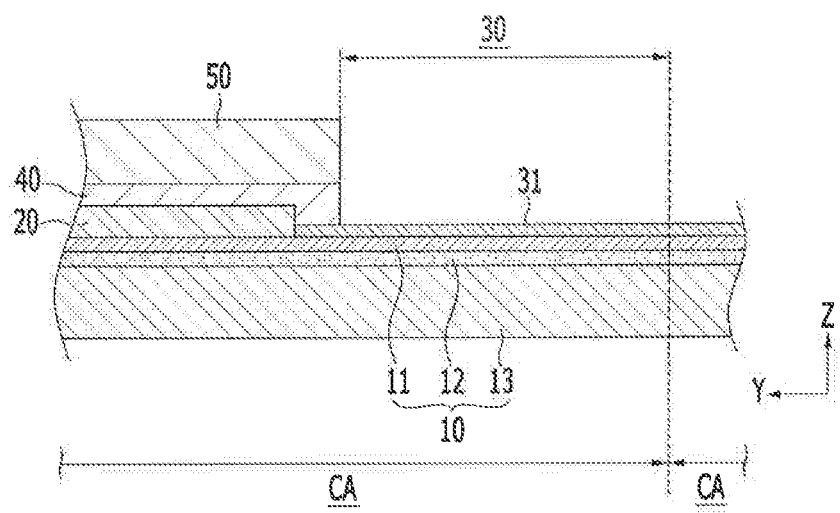

FIG. 5 and FIG. 6 are partial cross-sectional views of a main substrate and a passivation film in a second step shown in FIG. 1.

According to an embodiment, referring to FIG. 5 and FIG. 6, in step S20, the carrier substrate 90 is separated from the main substrate 11, and a lower passivation film 13 is attached to the second side 11b of the main substrate 11 by an adhesion layer 12. The passivation film 13 is thicker than the main substrate 11, and it may include, for example, polyethylene terephthalate. The main substrate 11, the adhesion layer 12, and the passivation film 13 make up a flexible substrate 10.

Figure 7:
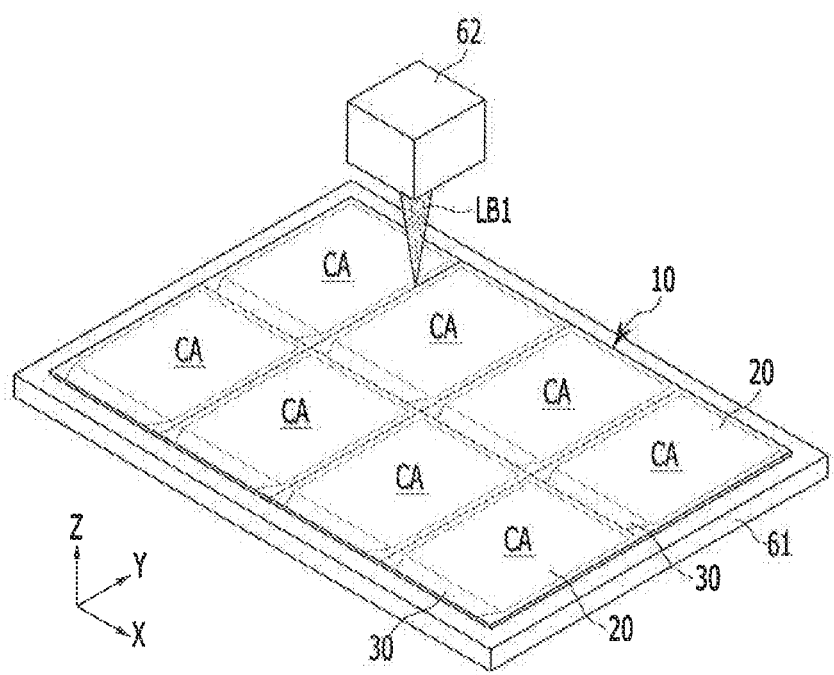
FIG. 7 and FIG. 8 are perspective views of a flexible substrate in a third step shown in FIG. 1.
Figure 8:
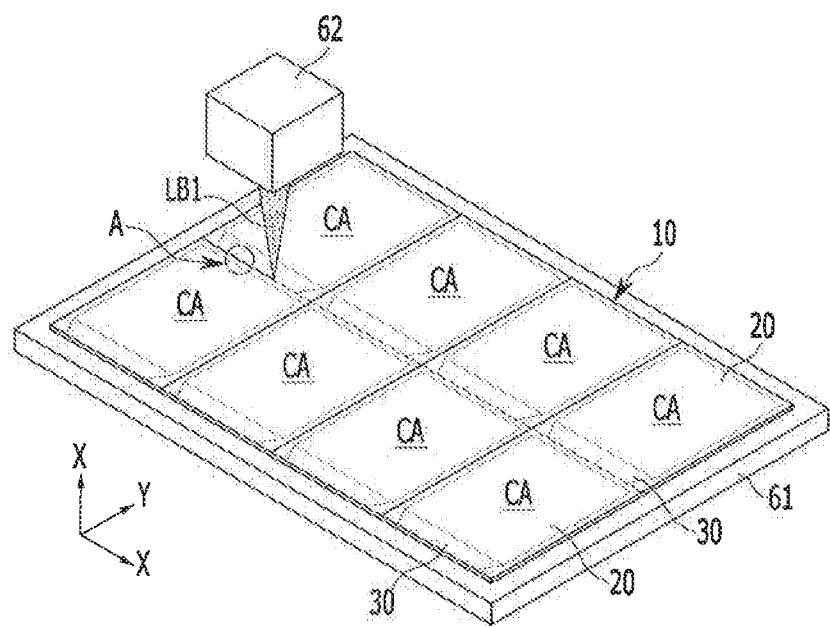

FIG. 7 and FIG. 8 are perspective views of a flexible substrate in a third step shown in FIG. 1.

According to an embodiment, referring to FIG. 7 and FIG. 8, in step S30, the flexible substrate 10 is mounted on a first stage 61, and a first laser oscillator 62 is provided over the flexible substrate 10. A first transfer unit is combined with one of the first stage 61 and the first laser oscillator 62.

In detail, the first laser oscillator 62 is disposed over one border line parallel to the Y direction between adjacent cell areas (CA), and irradiates a first laser beam LB1 to the border line. Simultaneously, either the first laser oscillator 62 is moved in the negative (−) Y direction by the first transfer unit, or the first stage 61 moves in the positive (+) Y direction.

According to an embodiment, the first laser beam LB1 is irradiated along the border line parallel to the Y direction to cut the flexible substrate 10. This incision is sequentially performed for all border lines that are parallel to the Y direction.

In addition, the first laser oscillator 62 is also provided over one border line parallel to the X direction, and irradiates the first laser beam LB1 to the border line. Simultaneously, either the first laser oscillator 62 is moved in the (+) X direction by the first transfer unit, or the first stage 61 moves in the (−) X direction.

According to an embodiment, the first laser beam LB1 is irradiated along the border line t parallel to the X direction to cut the flexible substrate 10. This incision is sequentially performed for all border lines that are parallel to the X direction.

For convenience of description, FIG. 7 shows that one X direction border line and three Y direction border lines are provided in the flexible substrate 10, but embodiments are not limited thereto, and in other embodiments the number of border lines on the flexible substrate 10 may be greater. By the incisions of step S30, the flexible substrate 10 is divided into the number of cell areas (CAs).

Figure 9:
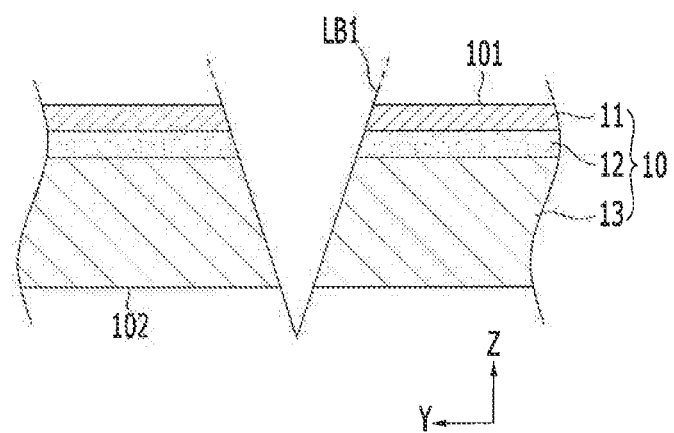
FIG. 9 and FIG. 10 are cross-sectional views of a flexible substrate that shows an enlarged region A of FIG. 8.
Figure 10:
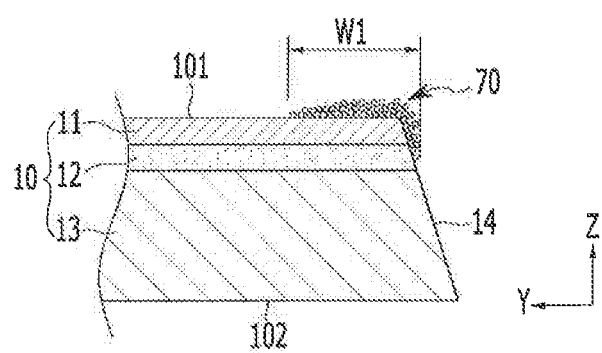
Figure 11:
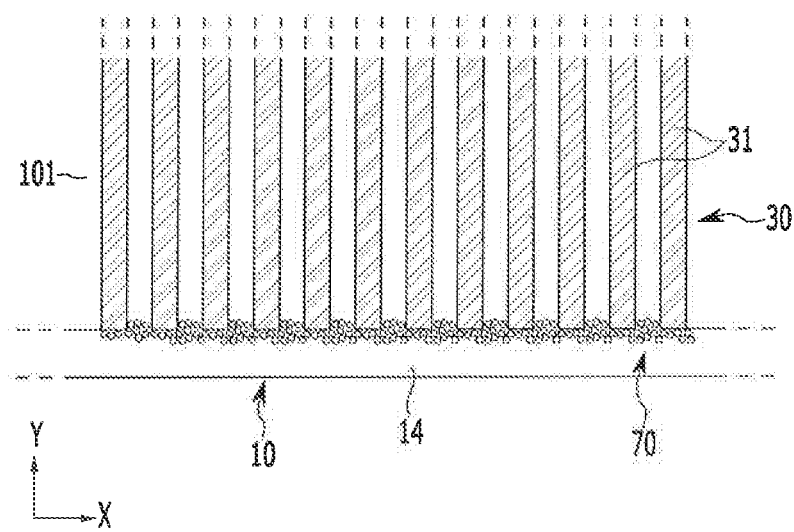
FIG. 11 is a top plan view of a region A of FIG. 8.

FIG. 9 and FIG. 10 are cross-sectional views of a flexible substrate that show an enlarged region A of FIG. 8, and FIG. 11 shows a top plan view of a region A of FIG. 8.

According to an embodiment, referring to FIG. 9 to FIG. 11, the first laser beam LB1 is an infrared wavelength laser beam, and, for example, may be a carbonate gas ($CO_2$) laser beam. A carbonate gas laser is a gas laser that uses a transition between vibrational levels of $CO_2$ molecules, and emits a substantially 9 μm to 10 μm wavelength laser beam.

According to an embodiment, the first laser beam LB1 irradiated onto the border lines between adjacent cell areas (CAs) may have a Gaussian or triangular cross-section, and the first laser beam LB1 is focused on or below a lower side 102 of the flexible substrate 10. A cutting surface 14 in the flexible substrate 10 is a slanted side corresponding to the shape of the first laser beam LB1. The slanted side may be straight or curved.

In step S30, the flexible substrate 10 may be damaged by heat from the first laser beam LB1, and as a result, foreign particles may be generated in or around the cutting surface 14. That is, the foreign particles may be generated in at least part of the cutting surface 14 and an edge portion of an upper side 101 of the flexible substrate 10 that is close to the cutting surface 14. Here, the upper side 101 of the flexible substrate 10 is a side where the display unit 20 and the pad portion 30 are disposed, and the lower side 102 of the flexible substrate 10 is the opposite side.

The foreign particle may be a conductive carbonized material 70 formed from the carbon of the plastic of the flexible substrate 10, and, for example, may be graphite. The conductive carbonized material 70 is primarily generated around the main substrate 11.

According to an embodiment, the pad electrodes 31 disposed on the pad portion 30 are substantially parallel to the Y direction, and end portions of the pad electrodes 31 are provided on one edge of the upper side 101 of the flexible substrate 10 that is parallel to the X direction. The conductive carbonized material 70 is generated among the plurality of pad electrodes 31 and can electrically connect the pad electrodes 31. In this case, the pad electrodes 31 can lose their original function of transmitting electrical signals, and generate driving defects.

Figure 12:
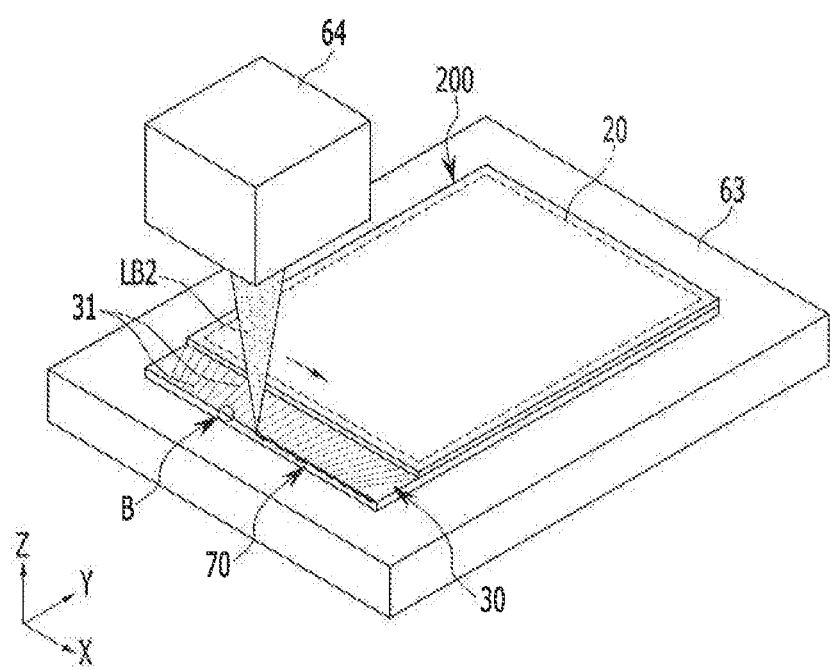
FIG. 12 is a perspective view of a flexible substrate in a fourth step shown in FIG. 1.

FIG. 12 is a perspective view of a flexible substrate in a fourth step shown in FIG. 1.

According to an embodiment, referring to FIG. 12, in step S40, the flexible substrate 10 is mounted on a second stage 63, and a second laser oscillator 64 is provided over the flexible substrate 10. A second transfer unit is combined with one of the second stage 63 and the second laser oscillator 64.

The second laser oscillator 64 irradiates a second laser beam LB2 onto an end portion of the flexible substrate 10 that is parallel to the X direction and that touches the end portions of the pad electrodes 31. Simultaneously, the second laser oscillator 64 is either moved in the (+) X direction by the second transfer unit, or the second stage 63 moves in the (−) X direction. The second laser beam LB2 is then irradiated along the end portion of the flexible substrate 10 parallel to the X direction to remove the conductive carbonized material 70.

In step S40, the second laser beam LB2 has a shorter wavelength than the first laser beam LB1, and it may be a short pulse (ultrashort pulse) laser beam with a pulse duration of femtoseconds or picoseconds.

According to an embodiment, a short pulse laser beam can minimize energy transfer because of the short pulse width and a high peak output, and does not generate physical or chemical deformation by heat diffusion or deteriorate the precision during a process. Further, unlike the first laser beam LB1, particles or by-products such as craters are rarely generated. Step S40 is respectively performed for a flexible display device 200.

In step S40, an irradiation width of the second laser beam LB2 is equal to or greater than a width W1 of the region of the conductive carbonized material 70, to remove the conductive carbonized material 70. For example, in step S20, the conductive carbonized material 70 may be generated over a region that is about 50 μm wide, and in step S40, the irradiation width of the second laser beam LB2 may be greater than about 50 μm.

According to an embodiment, the second laser beam LB2 may be a Gaussian or flat-top shaped beam. When a front end portion width of the second laser beam LB2 is greater than the width of the region of the conductive carbonized material 70, the conductive carbonized material 70 can be removed through a single scan, and when a front end portion width of the second laser beam LB2 is less than the width of the region of the conductive carbonized material 70, the conductive carbonized material 70 can be removed through at least two scans.

Figure 13:
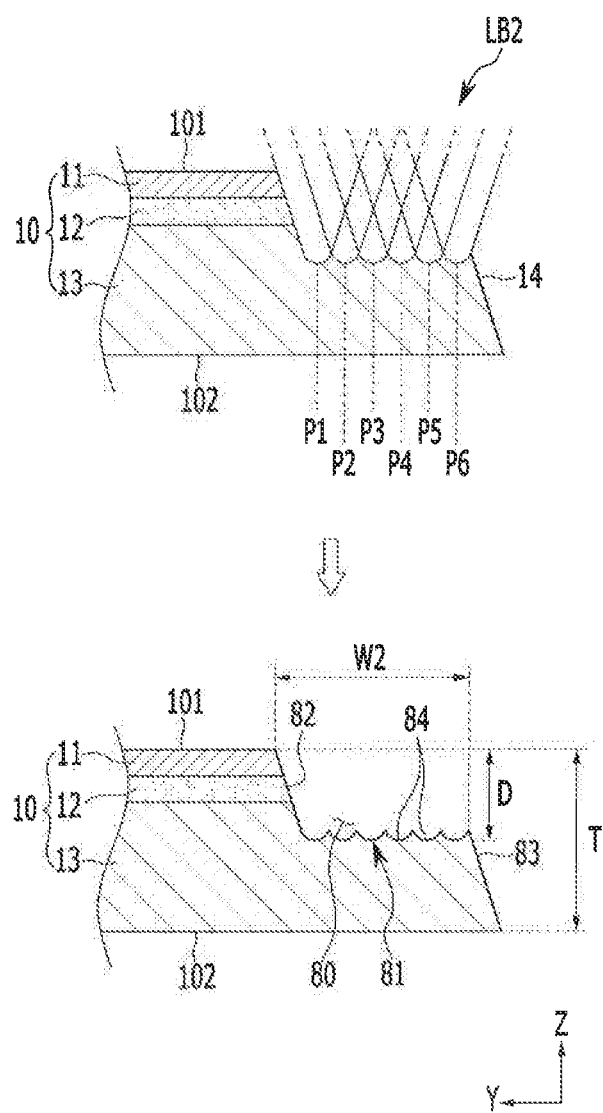
FIG. 13 is a cross-sectional view of a flexible substrate that shows an enlarged region B of FIG. 12.
Figure 14:
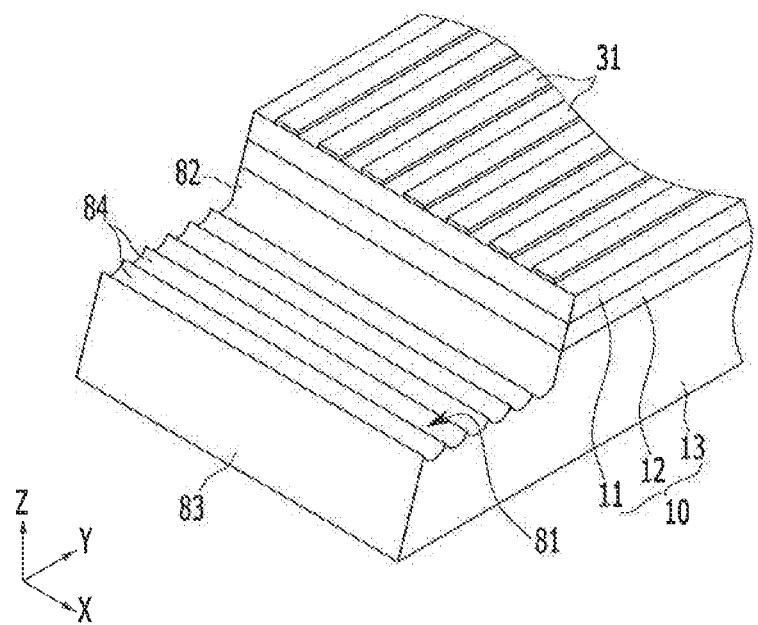
FIG. 14 is a perspective view of a flexible substrate that shows an enlarged region B of FIG. 12.

FIG. 13 and FIG. 14 are a cross-sectional view and a perspective view of a flexible substrate that shows an enlarged region B of FIG. 12.

According to an embodiment, referring to FIG. 12 to FIG. 14, the second laser beam LB2 is a Gaussian shaped beam, and the front end portion width of the second laser beam LB2 is less than the width W1 of the region of the conductive carbonized material 70.

According to an embodiment, step S40 includes: a first scanning process of focusing the second laser beam LB2 to a first position P1 in the flexible substrate 10 and moving the second laser beam LB2 in the X direction; and a second scanning process of focusing the second laser beam LB2 to a second position P2 that is separated in the Y direction from the first position P1 and moving the second laser beam LB2 in the X direction ( ).

According to an embodiment, to move the second laser beam LB2 to the second position P2 from the first position P1, the second laser oscillator 64 either moves in the (−) Y direction or the second stage 63 moves in the (+) Y direction. During a second scanning process, the second laser beam LB2 scans a region that overlaps a region scanned by the second laser beam LB2 in a first scanning process.

FIG. 13 shows, for example, a case in which the second laser beam LB2 has scanned the flexible substrate 10 six times, from the first position P1 to the sixth position P6, but the number of scans of the second laser beam LB2 are not limited thereto, and may differ in other embodiments. In this embodiment, distances between two adjacent positions (P1-P2, P2-P3, P3-P4, P4-P5, and P5-P6) from the first position P1 to the sixth position P6 is the same.

According to an embodiment, the second laser beam LB2 is focused into the flexible substrate 10, unlike the first laser beam LB1. FIG. 13 and FIG. 14 illustrate examples of a case in which the second laser beam LB2 is focused into the passivation film 13. A stepwise recess portion 80 is formed in the flexible substrate 10 by the second laser beam LB2 in step S40.

According to an embodiment, a depth (D) of the stepwise recess portion 80 is less than a thickness (T) of the flexible substrate 10, and a width W2 of the stepwise recess portion 80 corresponds to the irradiation width of the second laser beam LB2.

According to an embodiment, the stepwise recess portion 80 includes a bottom side 81 disposed in the passivation film 13, and a first lateral side 82 that connects the upper side 101 of the flexible substrate 10 and the bottom side 81 of the stepwise recess portion 80. The bottom side 81 is connected to the lower side 102 of the flexible substrate 10 by a second lateral side 83. The second lateral side 83 is a remaining portion of the cutting surface 14 generated in step S30.

According to an embodiment, the first lateral side 82 is slanted, corresponding to the shape of the second laser beam LB2. The slanted side may be straight or curved. A plurality of concave grooves 84 arranged in the Y direction are formed on the bottom side 81. a number of concave grooves 84 corresponds to a number of scans of the second laser beam LB2. The concave grooves 84 extend parallel to the X direction and are adjacent to each other in the Y direction.

Figure 15:
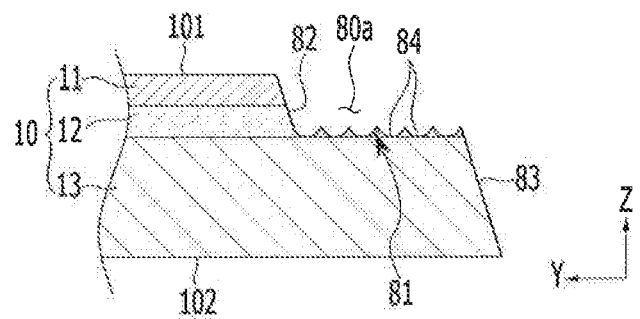
FIG. 15 is a cross-sectional view of a flexible substrate that shows a first exemplary variation of a stepwise recess portion shown in FIG. 13.

FIG. 15 is a cross-sectional view of a flexible substrate that shows a first exemplary variation of a stepwise recess portion shown in FIG. 13.

According to an embodiment, referring to FIG. 15, in step S40, the second laser beam LB2 is focused into the adhesion layer 12 or into a region of the adhesion layer 12 that borders the passivation film 13. In this case, the stepwise recess portion 80a includes a bottom side 81 disposed on the adhesion layer 12, and a first lateral side 82 that connects the upper side 101 of the flexible substrate 10 and the bottom side 81 of the stepwise recess portion 80a. A plurality of concaves grooves 84 adjacent to each other in the Y direction are formed in the bottom side 81.

Figure 16:
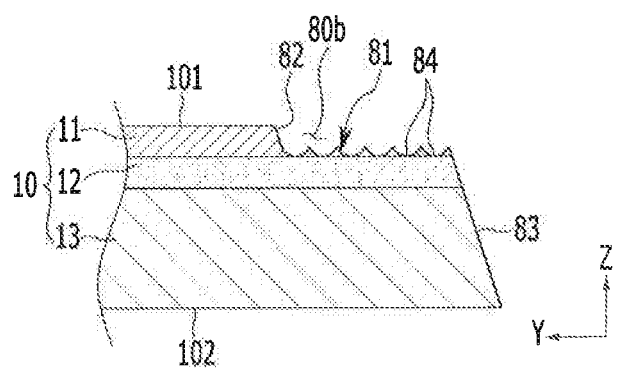
FIG. 16 is a cross-sectional view of a flexible substrate that shows a second exemplary variation of a stepwise recess portion shown in FIG. 13.

FIG. 16 is a cross-sectional view of a flexible substrate that shows a second exemplary variation of a stepwise recess portion shown in FIG. 13.

According to an embodiment, referring to FIG. 16, in step 840, the second laser beam LB2 is focused into the main substrate 11 or into a region of the main substrate 11 that borders the adhesion layer 12. In this case, a stepwise recess portion 80b includes a bottom side 81 disposed on the main substrate 11, and a first lateral side 82 that connecting the upper side 101 of the flexible substrate 10 and the bottom side 81 of the stepwise recess portion 80b. A plurality of concave grooves 84 adjacent to each other in the Y direction are formed in the bottom side 81.

Figure 17:
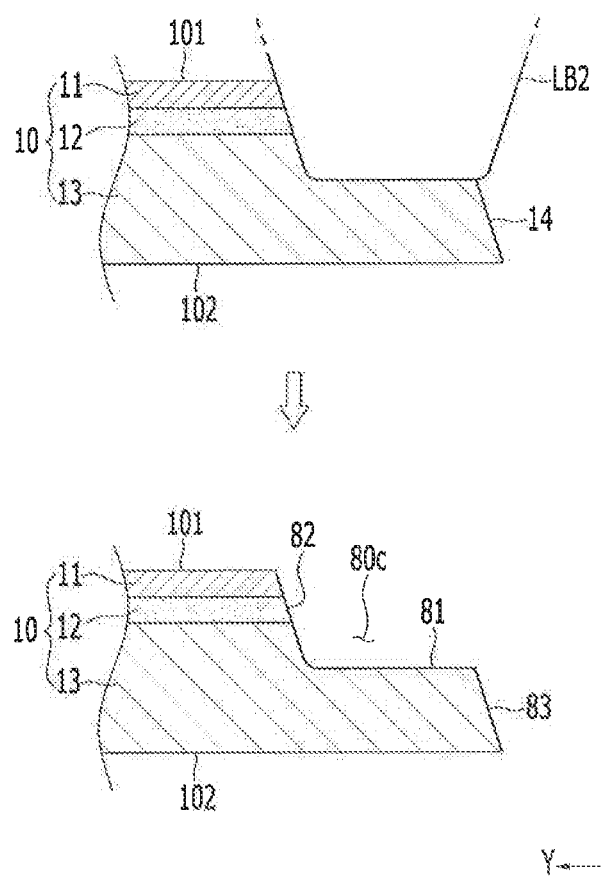
FIG. 17 and FIG. 18 are cross-sectional views of a flexible substrate that show a third exemplary variation of a stepwise recess portion shown in FIG. 13.
Figure 18:
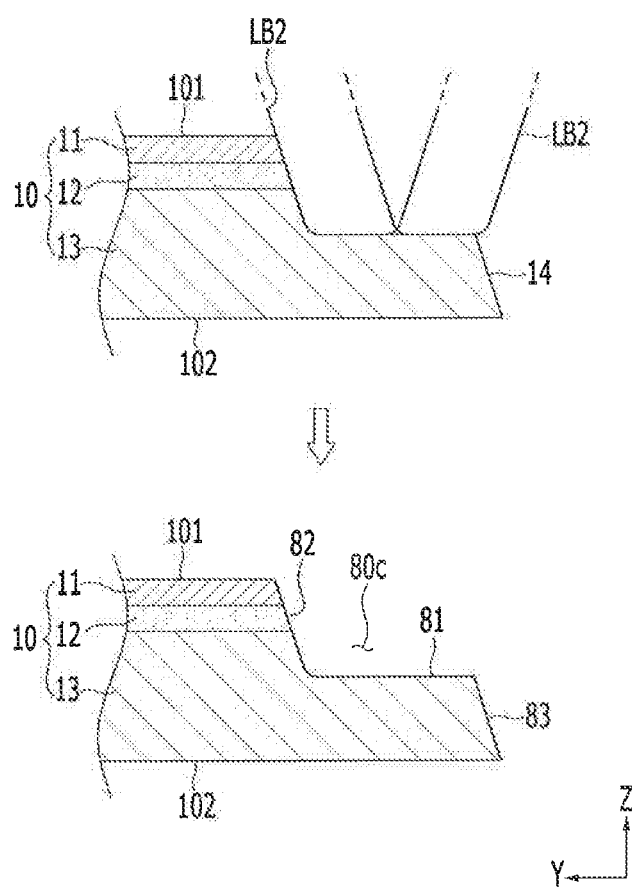

FIG. 17 and FIG. 18 are cross-sectional views of a flexible substrate that show a third exemplary variation of a stepwise recess portion shown in FIG. 13.

According to an embodiment, referring to FIG. 17 and FIG. 18, in step S40, the second laser beam LB2 has a flat front end, and the second laser beam LB2 is focused into the passivation film 13.

According to an embodiment, regarding FIG. 17, a width of a front end of the second laser beam LB2 is equal to or greater than the width W1 of the generation region of the conductive carbonized material 70. In this case, in step S40, the second laser beam LB2 is scanned once.

According to an embodiment, regarding FIG. 18, the width of the second laser beam LB2 is less than the width W1 of the generation region of the conductive carbonized material 70. In this case, in step 840, the second laser beam LB2 is scanned at least twice. Here, in the respective scanning operations, the irradiation positions of the second laser beam LB2 differ in the Y direction.

According to an embodiment, referring to FIG. 17 and FIG. 18, a stepwise recess portion 80c includes a bottom side 81 formed in the passivation film 13, and a first lateral side 82 that connects the upper side 101 of the flexible substrate 10 and the bottom side 81 of the stepwise recess portion 80c. The bottom side 81 is flat with few protrusions and depressions, and the first lateral side 82 is slanted.

Figure 19:
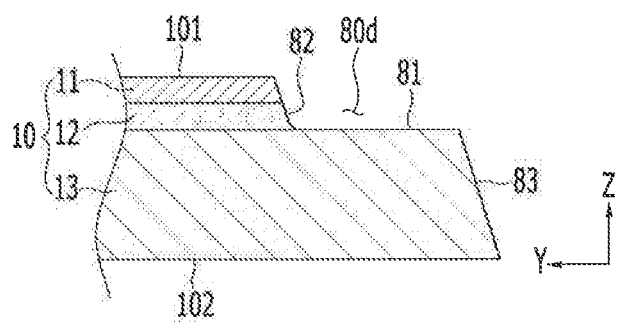
FIG. 19 is a cross-sectional view of a flexible substrate that shows a fourth exemplary variation of a stepwise recess portion shown in FIG. 13.

FIG. 19 is a cross-sectional view of a flexible substrate that shows a fourth exemplary variation of a stepwise recess portion shown in FIG. 13.

According to an embodiment, referring to FIG. 19, in step S40, the second laser beam LB2 has a flat front end, and the second laser beam LB2 is focused on region of the adhesion layer 12 that borders the passivation film 13. In this case, a stepwise recess portion 80d includes a bottom side 81 that corresponds to the upper side of the passivation film 13, and a first lateral side 82 that connects the upper side 101 of the flexible substrate 10 and the bottom side 81 of the stepwise recess portion 80d. The bottom side 81 is flat with few protrusions and depressions, and the first lateral side 82 is slanted.

Figure 20:
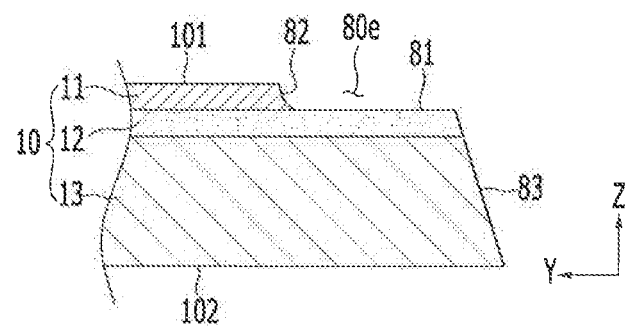
FIG. 20 is a cross-sectional view of a flexible substrate that shows a fifth exemplary variation of a stepwise recess portion shown in FIG. 13.

FIG. 20 is a cross-sectional view of a flexible substrate that shows a fifth exemplary variation of a stepwise recess portion shown in FIG. 13.

According to an embodiment, referring to FIG. 20, in step S40, the second laser beam LB2 has a flat front end, and the second laser beam is focused on a region of the main substrate 11 that borders the adhesion layer 12. In this case, a stepwise recess portion 80e includes a bottom side 81 that corresponds to the upper side of the adhesion layer 12, and a first lateral side 82 that connects the upper side 101 of the flexible substrate 10 and the bottom side 81 of the stepwise recess portion 80e. The bottom side 81 is flat with few protrusions and depressions, and the first lateral side 82 is slanted.

According to an embodiment, referring again to FIG. 1, substantially no conductive carbonized material 70 remain on the flexible substrate 10 after step S40, so that a plurality of pad electrodes 31 can remain insulators. Therefore, the flexible display device 200 manufactured according to above-described methods according to embodiments can prevent driving defects caused by electrical connections among the plurality of pad electrodes 31.

Table 1 shows test results of electrical connections of sample groups 1, 2, 3, and 4 according to a comparative example. The sample groups 1 to 4 according to a comparative example are samples of a flexible display device manufactured according to steps S10 and S20 of FIG. 1. Sample groups 1 to 4 according to a comparative example respectively include 90 samples.

TABLE 1

| Sample groups | Current values (A) | Results |
|---|---|---|
| 1 | Equal to or greater than $10^{-15}$ and less than $10^{-12}$: 17 samples<br>Equal to or greater than $10^{-12}$ and less than $10^{-9}$: 20 samples<br>Equal to or greater than $10^{-9}$: 53 samples | 58.89% of electrical connection |
| 2 | Equal to or greater than $10^{-15}$ and less than $10^{-12}$: 30 samples<br>Equal to or greater than $10^{-12}$ and less than $10^{-9}$: 22 samples<br>Equal to or greater than $10^{-9}$: 38 samples | 42.22% of electrical connection |
| 3 | Equal to or greater than $10^{-15}$ and less than $10^{-12}$: 4 samples<br>Equal to or greater than $10^{-12}$ and less than $10^{-9}$: 22 samples<br>Equal to or greater than $10^{-9}$: 64 samples | 71.11% of electrical connection |
| 4 | Equal to or greater than $10^{-15}$ and less than $10^{-12}$: 2 samples<br>Equal to or greater than $10^{-12}$ and less than $10^{-9}$: 12 samples<br>Equal to or greater than $10^{-9}$: 77 samples | 85.56% of electrical connection |

During the electrical connections test, two nanoprobes are provided to contact two points of the end portion of the pad portion, an electrical signal is applied to one nanoprobe, and a current value detected from the other nanoprobe is set to be a reference value. When the measured current value is equal to or greater than $10^{-9}$ A, it is classified as electrically connected. As expressed in Table 1, the sample groups show high electrical connection rates in order of 4, 3, 1, and 2.

Table 2 expresses test results of electrical connection of sample groups 5, 6, 7, and 8 according to an exemplary embodiment. The sample groups 5 to 8 according to an exemplary embodiment are samples of a flexible display device manufactured according to steps S10, S20, step S30 of FIG. 1. Sample groups 5 to 8 according to an exemplary embodiment respectively include 90 samples.

TABLE 2

| Sample groups | Current values (A) | Results |
|---|---|---|
| 5 | Equal to or greater than $10^{-15}$ and less than $10^{-12}$: 90 samples<br>Equal to or greater than $10^{-12}$ and less than $10^{-9}$: 0 samples<br>Equal to or greater than $10^{-9}$: 0 samples | No electrical connection |
| 6 | Equal to or greater than $10^{-15}$ and less than $10^{-12}$: 90 samples<br>Equal to or greater than $10^{-12}$ and less than $10^{-9}$: 0 samples<br>Equal to or greater than $10^{-9}$: 0 samples | No electrical connection |
| 7 | Equal to or greater than $10^{-15}$ and less than $10^{-12}$: 89 samples<br>Equal to or greater than $10^{-12}$ and less than $10^{-9}$: 1 samples<br>Equal to or greater than $10^{-9}$: 0 samples | No electrical connection |
| 8 | Equal to or greater than $10^{-15}$ and less than $10^{-12}$: 90 samples<br>Equal to or greater than $10^{-12}$ and less than $10^{-9}$: 0 samples<br>Equal to or greater than $10^{-9}$: 0 samples | No electrical connection |

The electrical connections test is performed in a manner similar to that of sample groups 1 to 4 according to a comparative example. As expressed in Table 2, it can be seen that the sample groups 5 to 8 according to an exemplary embodiment do not generate electrical connections.

According to embodiments, the second laser beam LB2 removes part of the flexible substrate 10 in a thickness direction of the flexible substrate 10 to leave the stepwise recess portion 80. Therefore, the cutting surface 14 of the flexible substrate 10 formed in step S30 maintains its shape during step S40. This indicates that when a plurality of cell areas (CAs) are formed in the main substrate 11 in step S10, there is no need to provide a dummy area between the cell areas (CAs) in the Y direction.

Assuming that part of the flexible substrate that corresponds to the region where conductive carbonized material is generated is removed, the final cutting surface of the flexible substrate is inward from from the cutting surface generated in step S30. In this case, when a plurality of cell areas are formed on the main substrate in step S10, dummy areas must be provided by the removed region among a plurality of cell areas arranged in the Y direction.

According to the present exemplary embodiment, there is no dummy area among the cell areas (CA) arranged in the Y direction, which increases the usable area of the flexible substrate 10 and improves productivity.

While this disclosure has been described in connection with what is presently considered to be practical exemplary embodiments, it is to be understood that the disclosure is not limited to the disclosed exemplary embodiments, but, on the contrary, is intended to cover various modifications and equivalent arrangements included within the spirit and scope of the appended claims.

What is claimed is:

1. A flexible display device, comprising:
a flexible substrate;
a display unit disposed in a first region of a first side of the flexible substrate and that includes a plurality of pixels; and
a pad portion disposed in a second region of the first side and that includes a plurality of pad electrodes,
wherein the flexible substrate includes a stepwise recess portion recessed into the first side along an edge of the first side on which end portions of the pad electrodes are provided,
wherein the stepwise recess portion includes a bottom side and a first lateral side that connects the first side and the bottom side, wherein the bottom side has protrusions and depressions associated with a plurality of concave grooves, wherein the concave grooves are adjacent to each other in a first direction parallel to the pad electrodes and extend linearly in a second direction perpendicular to the first direction.

2. The flexible display device of claim 1, wherein the first lateral side is slanted.

3. The flexible display device of claim 1, wherein the flexible substrate includes:
a main substrate that includes a first side and a second side that are opposite each other; and
a passivation film attached to the second side by an adhesion layer,
wherein the display unit and the pad portion are provided on the first side.

4. The flexible display device of claim 3, wherein the stepwise recess portion is recessed into the main substrate, is recessed into the main substrate and the adhesion layer, or is recessed into the main substrate, the adhesion layer, and the passivation film.

5. A flexible display device, comprising:
a flexible substrate that includes a main substrate with a first side and a second side that are opposite each other; and a passivation film attached to the second side by an adhesion layer;
a display unit disposed in a first region of the first side of the flexible substrate and that includes a plurality of pixels; and
a pad portion disposed in a second region of the first side and that includes a plurality of pad electrodes,
wherein the flexible substrate includes a stepwise recess portion recessed into an end portion thereof,
wherein the stepwise recess portion is recessed into the main substrate, is recessed into the main substrate and the adhesion layer, or is recessed into the main substrate, the adhesion layer, and the passivation film,
wherein the stepwise recess portion is recessed into the first side along an edge of the first side on which end portions of the pad electrodes are provided.

6. The flexible display device of claim 5, wherein the stepwise recess portion includes a bottom side and a first lateral side that connects the first side and the bottom side.

7. The flexible display device of claim 6, wherein the bottom side has protrusions and depressions associated with a plurality of concave grooves that are adjacent to each other in a first direction parallel to the pad electrodes and extend linearly in a second direction perpendicular to the first direction.

8. The flexible display device of claim 6, wherein the bottom side is flat.

9. The flexible display device of claim 6, wherein the first lateral side is slanted.

* * * * *